United States Patent [19]

Nerem

[11] 4,061,930
[45] Dec. 6, 1977

[54] BASE DRIVE INHIBIT CIRCUIT

[75] Inventor: Arne Nerem, San Diego, Calif.

[73] Assignee: Rohr Industries, Incorporated, Chula Vista, Calif.

[21] Appl. No.: 695,014

[22] Filed: June 11, 1976

[51] Int. Cl.² .......................................... H03K 17/60
[52] U.S. Cl. .................................. 307/254; 307/243; 323/23; 330/262
[58] Field of Search .................. 307/243, 235 N, 237, 307/254; 323/23, 25; 330/13, 15

[56] References Cited

U.S. PATENT DOCUMENTS

| | | | |
|---|---|---|---|
| 3,483,425 | 12/1969 | Yanishevsky | 330/13 X |
| 3,490,027 | 1/1970 | Galetto et al. | 330/15 X |

Primary Examiner—Juan Zazworsky
Attorney, Agent, or Firm—Patrick J. Schlesinger; Frank D. Gilliam

[57] ABSTRACT

A base drive inhibit circuit for positive and negative phase transistors of a switching amplifier. The circuit comprises a pair of comparators for comparing the voltage between the collector and emitter elements of the transistors with an appropriate reference voltage, and provides a signal to supply base drive voltage, when their associated output transistor is in a forward biased state and the level of reference voltage is less than the level of voltage between the collector and emitter. A logic control circuit supplies base drive voltage to one of the transistors when both a drive signal from an external source is in a proper polarity state and the output signal from the comparator indicates that the transistor is in a forward biased state.

A timer is provided to delay base drive voltage to either transistor when the base drive signal is in a transition between polarity states.

4 Claims, 3 Drawing Figures

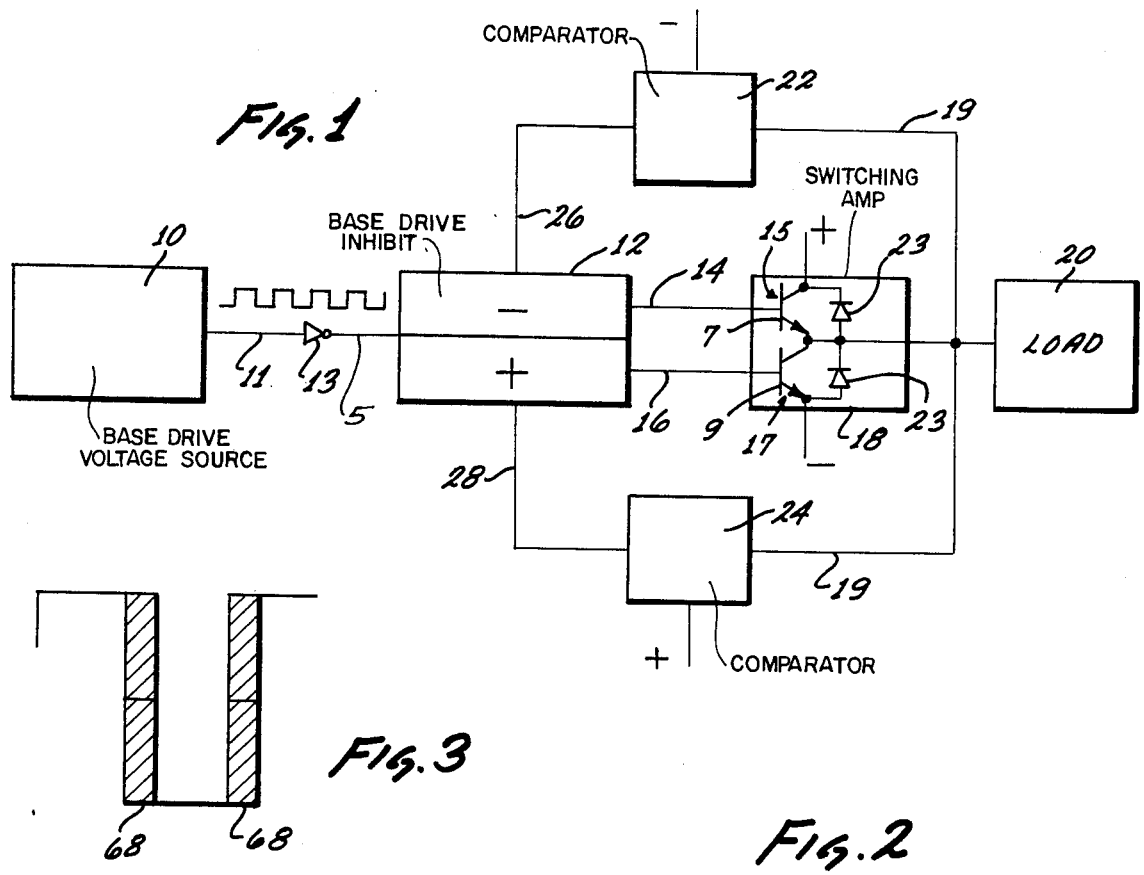
Fig. 1
Fig. 3
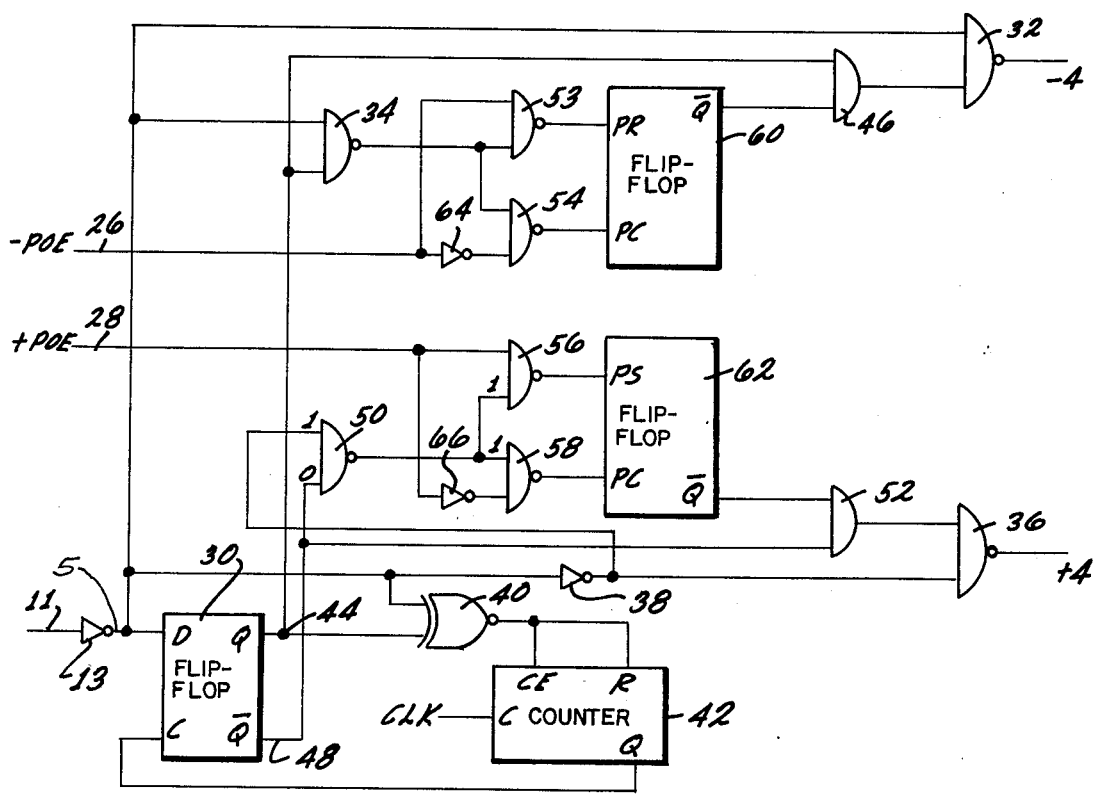
Fig. 2

BASE DRIVE INHIBIT CIRCUIT

BACKGROUND OF THE INVENTION

This invention relates generally to switching amplifiers and more specifically to inhibiting base drive to switching transistors when they are in a reverse biased or in a free-wheeling mode.

There are various switching amplifiers utilized for controlling large output currents for the control and operation of various large electrical equipment, such as, linear induction motors where the load current and frequency are varied over a large range.

The efficiency of these devices depends in part on the efficiency of the power amplifier. Commonly available power amplifiers do not operate at maximum efficiency in that there is no control for removing base drive to the power amplifier transistors when they are not in a forward biased mode, when there is a malfunction in the amplifier circuit or when the drive signal is in a transition between polarity states.

A control circuit for a switching amplifier that removes base drive to one or both of the output transistors when in a condition of normal reverse biased or free-wheeling mode would find considerable commercial acceptance.

SUMMARY OF THE INVENTION

The present invention obtains the various benefits of the prior art switching amplifier devices and improves their operating efficiency by reducing base drive power consumption of the switching transistors by 50 percent.

The principal object of the invention is to eliminate base drive to a power transistor during the time the load current flows through its parallel free-wheel diode, and the time the transistor changes state as the drive signal makes its transition from positive to negative or negative to positive state.

Another object of this invention is to remove base drive voltage supply to a transistor of a switching amplifier when the transistor is not forward biased.

The above and other features and objects of the instant invention will be readily apparent as the description continues while being read in conjunction with the appended drawings.

DESCRIPTION OF THE DRAWINGS

FIG. 1, is a block diagram of a power control system utilizing the base inhibit circuit of the invention.

FIG. 2, is a schematic diagram of the circuit of the instant invention.

FIG. 3, shows the base drive input signal wave form including transistor transition time delay.

PREFERRED EMBODIMENT OF THE INVENTION

The invention pertains to an electronic circuit for selectively inhibiting nase drive voltage to a switching amplifier having a pair of output transistors. The inhibit circuit is positioned in series between the base drive voltage supply source and the base of the output transistors of the switching amplifier and receives a feed back control signal from the output of the transistors. The circuit functions in a manner so as to remove all base drive voltage from the transistors for a selected time when the base drive signal changes polarity state or from a transistor when the transistor is not in a forward biased state.

Referring specifically now to FIG. 1, a block diagram of a typical environment of the invention is shown. A source 10 of base drive voltage is provided, such as, but not limited to, a pulse width modulated square wave as described in U.S. Pat. No. 28,432. The base drive voltage from source 10 is supplied to the drive input of the base drive inhibit circuit 12, hereinafter described in detail, through inverter buffer element 13. The base elements 7, 9 of both the minus and positive phase output switching transistors 15, 17, respectively, of the switching amplifier 18 are connected to an appropriate output from the inhibit circuit 12 through lines 14, 16, respectively. The output of the switching amplifier 18 supplies full wave power to load 20 through line 21. The load 20 may be, but not limited to, the field of a linear induction motor such as those used in the transportation field. The output voltage on line 19 is fed back to one input of operational amplifier 25 of a pair of comparators 22, 24 where this voltage level is compared with a pre-selected level of reference voltage which is fed into the other input of each operational amplifier 25. Any comparator capable of producing an output voltage level representing the difference between a pair of input voltage levels may be employed, a typical example being that shown and described on page 45 of "Handbook of Operational Amplifier Applications" 1963, published by Burr-Brown Research Corporation or any other known voltage comparator circuit performing the same or similar function. The reference voltage supplied to the negative phase transistor comparator is at a level scaled to the voltage between the collector and emitter elements that is typical of normal operation of the transistor, i.e., when the transistor normally operates with, as an example, 5 Volts difference between the collector and emitter, the reference voltage represents 5 Volts. The reference voltage supplied to the positive phase transistor comparator will be at the collector D.C. supply level minus the drop across the positive phase transistor, i.e., using the same transistor as in the negative phase section, if the D.C. supply was 300V D.C. and the transistor has a normal 5V D.C. drop under proper operating conditions then the reference voltage would represent 295V D.C. If the voltage from line 19 is less than the reference voltage, then that comparator will have a high or binary 1 output signal. If, on the other hand, the voltage from line 19 is greater than the reference voltage level, than that comparator output will have a low or binary 0 output signal. The comparators provide outputs on lines 26, 28 connected to their respective minus and positive phase inhibit circuit 12 inputs as hereinafter discussed.

The switching amplifier 18 has a pair of output power transistors 15, 17 and free-wheel diodes 23 wired in a conventional manner so as to provide a full wave output signal.

Referring now to FIG. 2, a source of output transistor drive signal 11 is applied to the D input of a D flip-flop 30, one input of a NAND gate 32, one input to NAND gate 34, one input of a NAND gate 36 through a series inverter buffer 38 and one input of exclusive NOR gate 40. The C input of the D flip-flop 30 is provided by a counter 42 that provides an output at a pre-selected time delay responsive to the polarity change of the incoming drive voltage 5. The Q or high output 44 of the D flip-flop 30 is connected to the other input of the exclusive NOR gate 40, the other input of NAND gate 34 and one input of AND gate 46. The $\overline{Q}$ or low output 48 of flip-flop 30 provides an input to NAND gate 50 and to AND gate 52. The output of inverter 38 further provides the other input to NAND gate 50.

The output of NAND gate 34 supplies inputs to NAND gate 53 and NAND gate 54. The output of NAND gate 50 supplies inputs to NAND gate 56 and NAND gate 58. The outputs from NAND gates 53, 54 supply preset PR and preclear PC inputs, respectively, to D flip-flop 60. The outputs from NAND gates 56, 58 supply the preset PR and preclear PC inputs, respectively, to D flip-flop 62. The second input of NAND gate 54 is supplied through inverter 64 from the minus phase voltage comparator 22 hereinbefore described. The second input to NAND gate 58 is supplied through inverter 66 from the positive phase voltage comparator 24 hereinbefore described.

The $\overline{Q}$ output of D flop-flop 60 supplies the other input to AND gate 46. Likewise the $\overline{Q}$ output of D flip-flop 62 supplies the other input to AND gate 52. The outputs of NAND gates 32, 36 provide base drive voltage to the respective plus and minus phase switching power transistors, respectively, either directly or indirectly through associated driver stages.

The output from exclusive NOR gate 40 provides an input to the time delay circuit of counter 42. A timing pulse CLK is supplied from a timing source (not shown) of a selected frequency to operate the counter 42 to clock the counter at a selected speed, the speed is in generally micro second pulses. The Q or time delay output of the counter supplies a pulse to the clock input C of D flip-flop 30 to shift the flip-flop state to the state of its control input D. If D is in a high state this results in a high Q and low $\overline{Q}$. The time delay can be selected to be compatible with the switching limitations of the output transistors. Referring now to FIG. 3, a representation of the input wave shape is shown. All transistors take a specific amount of time making a transition from on to off and from off to on. These time delays are shown by shaded area 68. Because different transistors have different characteristics these transistor times will vary. The time delay of counter 42 is selected so that the transistors will have no base drive voltage provided during their transition states.

The outputs of NAND gates 32, 36, supply base drive signals to their respective minus and positive output transistors of full wave switching amplifier 18.

The electronic components of the FIGS. 1 and 2 are typically as follows. D flip-flop 30 is a model SN 7474 manufactured by Texas Instrument Company or an equivalent device. EX-NOR gate 40 is a model SN 74L S 266 device manufactured by Texas Instrument Company or an equivalent device. The flip-flops 60, 62 are the same devices as D flip-flop 30, except for the input and output connections. The NAND gates 32, 34, 36, 50, 53, 54, 56 and 58 are model SN 7400 devices manufactured by Texas Instruments Company or an equivalent device. The inverters 38, 64, 66 are model SN 7404 devices manufactured by Texas Instruments Company or an equivalent device. There are six of these inverter devices in a single package. Single units having the same or similar characteristics may, of course, be utilized. AND gates 46, 52 are model SN 7408 devices manufactured by Texas Instruments Company or an equivalent device. Counter 42 may be a MOS counter model CD 4017 such as those manufactured by RCA or a device equivalent thereto capable of performing the function discussed. The various other components, such as the transistors, etc., are well known in the electronic art.

OPERATION OF THE PREFERRED EMBODIMENT

Referring now to the various FIGS., at a given instant all of the components are energized from an off mode. Assume the instantaneous drive signal level on line 5 is negative going, this is produced by inverting a positive going drive signal from line 11 and thereby producing a binary 0 level signal. The D.C. supplies are energized. Neither, switching transistor is conducting. In this condition both switching transistors have a voltage across the collector to emitter element greater than the present reference voltage present at comparators 22, 24. At this instant in time the following sequence of events occurs within the inhibit circuit. Line 26 is supplied a binary 0, likewise line 28 is supplied a binary 0. The D input of D flip-flop 30 is supplied a binary 0. The Q output of the D flip-flop 30 is also at a binary 0 state while the $\overline{Q}$ of the same flip-flop is in a binary 1 state. One input to NAND gate 34, NAND gate 32, exclusive OR gate 40 and the input to inverter 38 have a binary 0. A binary 0 is present at the other input of NAND gate 34 and AND gate 46 as these points are common with the Q output of the D flip-flop 30.

NAND gate 34's output goes high producing a binary 1. NAND gates 53, 54 each have one input from NAND gate 34. The other input is supplied through line 26, NAND gate 53 directly and NAND gate 54 indirectly through inverter 64. The output of inverter 64 supplies a binary 1 and the output from NAND gate 54 is a binary 0. The pre-set input of flip-flop 60 now has a binary 1 present and the pre-clear input a binary 0. This condition provides a binary 1 at the output $\overline{Q}$. The other input to AND gate 46 is therefore a binary 1. The output of AND gate 46 supplies a binary 0 to the other input of NAND gate 32. NAND gate 32 now has a second binary 0 input causing the output condition to remain a binary 1 output. This binary 1 indicates a no-go condition to the negative phase transistor and base drive voltage is therefore not supplied.

NAND gate 50 having both inputs binary 1 has a binary 0 output.

The binary 0 output from NAND gate 50 is supplied to one input of NAND gates 56, 58. The other input to NAND gates 56, 58 is supplied directly and through an inverter respectively from line 28. Thus NAND gate 56 has both inputs binary 0 and therefore, supplies a binary 1 to the pre-set input to flip-flop 62. NAND gate 58 has a binary 1 and a binary 0 input and, therefore, supplies a binary 1 to the pre-clear input of the same flip-flop. $\overline{Q}$ of the flip-flop, therefore, remains in its previous state which in this instant is assumed to be a binary 0. The $\overline{Q}$ output provides a binary 0 to the other input of AND gate 52. The binary 0 and binary 1 inputs to AND gate 52 provides a binary 0 as the other input to NAND gate 36 producing a binary 1 or no-go signal allowing no base drive voltage to the positive phase output transistor. In the instantaneous condition stated there would be no base drive voltage to the power amplifier and therefore no output. It is now assumed that the signal input D on flip-flop 30 makes a transition to a binary 1.

This conditions the exclusive NOR gate 40 providing a start pulse to counter 42. For the aforementioned specific output transistor, the counter was programmed to provide a Q binary 1 output pulse to the C clock input of D flip-flop 30 after eleven micro-seconds.

After the eleven micro-seconds have passed and if the inputs on lines 26, 28 and 11 remain at binary 0 then the following events occur. The Q output of flip-flop 30 changes to binary 1 and the $\overline{Q}$ to a binary 0. The input of AND gate 46 supplied from the Q output is now a binary 1, with the other input remaining a binary 1 the output is now a binary 1. The inputs to NAND gate 32 now being binary 1, the output of the NAND gate changes to a binary 0 or go condition and supplies a base drive voltage to the negative phase transistor 15.

The input from $\overline{Q}$ to NAND gate 50 changes to a binary 0 changing the output of the NAND gate 50 to a binary 1. The input of NAND gate 58 having one binary 1 and one binary 0 input remains the same. The output of NAND gate 58 now having two binary 1 inputs changes to binary 0 causing flip-flop 62 to pre-clear providing a binary 1 output at $\overline{Q}$. NAND gate 36 now has one binary 1 input and one binary 0 input and its output remains binary 1 or a no go condition for the positive phase transistor 17.

It should now be obvious that when the signal on terminal D of flip-flop 30 changes from binary 1 to a binary 0 there will be no base drive to the output transistors. After 11 micro-seconds, or any other pre-selected time delay for timing counter 42, a base drive will be supplied to the base of the positive phase output transistor. Likewise when the signal on terminal D of flip-flop 30 changes from binary 0, to a binary 1 there will be no base drive to the output transistors. After the preselected time delay base drive will be supplied to the base of the negative output transistor. Note that a binary 1 on input line 26 or 28, will result in an inhibit of the minus phase transistor or positive phase transistor, respectively. This being the condition where the voltage between the collector and emitter elements is less than the appropriate reference voltage for the transistor in question, such as when free-wheeling occurs. The respective transistor is therefore not turned on, thus, perserving base drive power for the free-wheeling period resulting in 50% reduction of base drive power.

At such times when the respective comparators 22, 24, have a 1 level output, the D flip-flops 60, 62 will have a $\overline{Q}$ output of 0, respectively, thus resulting in the inhibit of NAND gates 32, 36 through AND gates 46, 52.

Many changes may be made in the details of the instant invention, in the method and materials of fabrication, in the configuration and assemblage of the consistent elements, without departing from the spirit and scope of the appended claims, which changes are intended to be embraced therewithin.

Having thus described the invention, what is claimed as new and useful and desired to be secured by United States Letters Patent is:

1. A base drive inhibit circuit for positive and negative phase transistors of a switching amplifier comprising:
   a source of base drive voltage having alternate positive and negative states;
   a first means for producing a first signal responsive to the conduction state of said positive phase transistor and a positive phase reference voltage level;
   a second means for producing a second signal responsive to the conduction state of said negative phase transistors and a negative phase reference voltage level; and
   a control means for selectively supplying said base drive voltage from said source to said positive phase transistor when said first signal indicates that said positive transistor is in a forward biased state with respect to said positive reference voltage level and said base drive voltage is in a positive state and to said negative phase transistor when said second signal indicates that said negative transistor is in a forward biased state with respect to said negative reference voltage level and said base drive voltage is in a negative state.

2. The invention as defined in claim 1, wherein said control means additionally removes said base drive voltage to said positive phase and negative phase transistors for a predetermined length of time while said base drive voltage is making a transition between its alternate positive and negative states.

3. The invention of claim 2, wherein said first means comprises a comparator for comparing the positive phase reference voltage with the conductive state of said positive transistor and producing said first signal when said positive phase transistor is in a forward biased state and said positive phase reference voltage is less than the voltage between the collector and emitter elements of said positive phase transistor.

4. The invention of claim 2, wherein said second means is a comparator for comparing the negative phase reference voltage with the conduction state of said negative phase transistor and producing said second signal when said negative phase transistor is in a forward biased state and said negative reference voltage is less than the voltage between the collector and emitter elements of said negative phase transistor.

* * * * *